United States Patent

[11] 3,611,059

[72] Inventor Donald Raymond Carley
Somerville, N.J.
[21] Appl. No. 45,434
[22] Filed June 11, 1970
[45] Patented Oct. 5, 1971
[73] Assignee RCA Corporation

[54] TRANSISTOR ASSEMBLY
10 Claims, 3 Drawing Figs.

[52] U.S. Cl. .......... 317/234, 317/235
[51] Int. Cl. .......... H01l 1/12
[50] Field of Search .......... 317/234, 235, 234 (1); 11/234 (4)

[56] References Cited
UNITED STATES PATENTS

| | | | |
|---|---|---|---|
| 2,791,731 | 5/1957 | Walker et al. | 317/234 |
| 2,792,537 | 5/1957 | Martin | 317/234 |
| 2,956,160 | 10/1960 | Sharpless | 250/31 |
| 2,984,890 | 5/1961 | Hambar et al. | 317/234 X |
| 2,987,658 | 6/1961 | Messenger | 317/234 |
| 3,266,137 | 8/1966 | Mille et al. | 317/234 X |

*Primary Examiner*—James D. Kallam
*Attorney*—Glenn H. Bruestle

ABSTRACT: A transistor assembly for high-frequency operation includes a housing of an electrically insulating and thermally conductive material having a passage therethrough from one end to the other end. A transistor element having collector, emitter and base electrodes is mounted in the passage adjacent one end of the housing, and is thermally connected to the housing. A separate contact terminal having a head on one end is secured to each end of the housing with the terminals being in the same plane and the heads extending across the ends of the passage so as to hermetically seal the transistor element within the housing. A metal plate is secured to the outer surface of the housing. The metal plate serves as the mounting means for the assembly, a heat dissipator and a third terminal. The electrodes of the transistor element are electrically connected to separate ones of the terminals.

INVENTOR.
DONALD R. CARLEY
BY
Donald S. Cohen
Attorney

INVENTOR.
DONALD R. CARLEY
BY
Donald S. Cohen
Attorney

TRANSISTOR ASSEMBLY

BACKGROUND OF INVENTION

The present invention relates to a transistor assembly and more particularly to a transistor assembly which can be used in a microstrip or stripline circuit.

With the increasing use of power transistors in electrical circuits which operate at high frequencies, such as UHF and microwave frequencies, it has become necessary to design package assemblies for such transistors which permit the transistors to operate properly in such circuits. Although the package assemblies for the transistors which have been used in the lower frequency operating circuits generally have acceptable mechanical and thermal capabilities, such package assemblies are not suitable for use at the higher frequencies because of parasitic inductances and capacitance. Thus, a transistor assembly for UHF and microwave frequency operation must maintain the heat dissipation, ease of assembly and hermeticity properties of the low-frequency assemblies and in addition have minimal lead lengths and interelectrode capacitances. Also, it is desirable that the higher frequency assemblies be of a design to permit them to be used in distributed line circuits, particularly microstrip and stripline types of circuits.

SUMMARY OF INVENTION

A semiconductor assembly includes a housing of an electrically insulating and thermally conductive material having a passage extending therethrough from one end to the other. A semiconductor element having a plurality of electrodes is mounted in the housing and thermally connected to the housing. A first terminal is provided on the outer surface of the housing and a pair of contact terminals are secured one to each end of the housing. The contact terminals extend over the ends of the passage in the housing so as to enclose the passage. The electrodes of the semiconductor element are electrically connected to the terminals on the housing.

DETAILED DESCRIPTION

Figure 1:
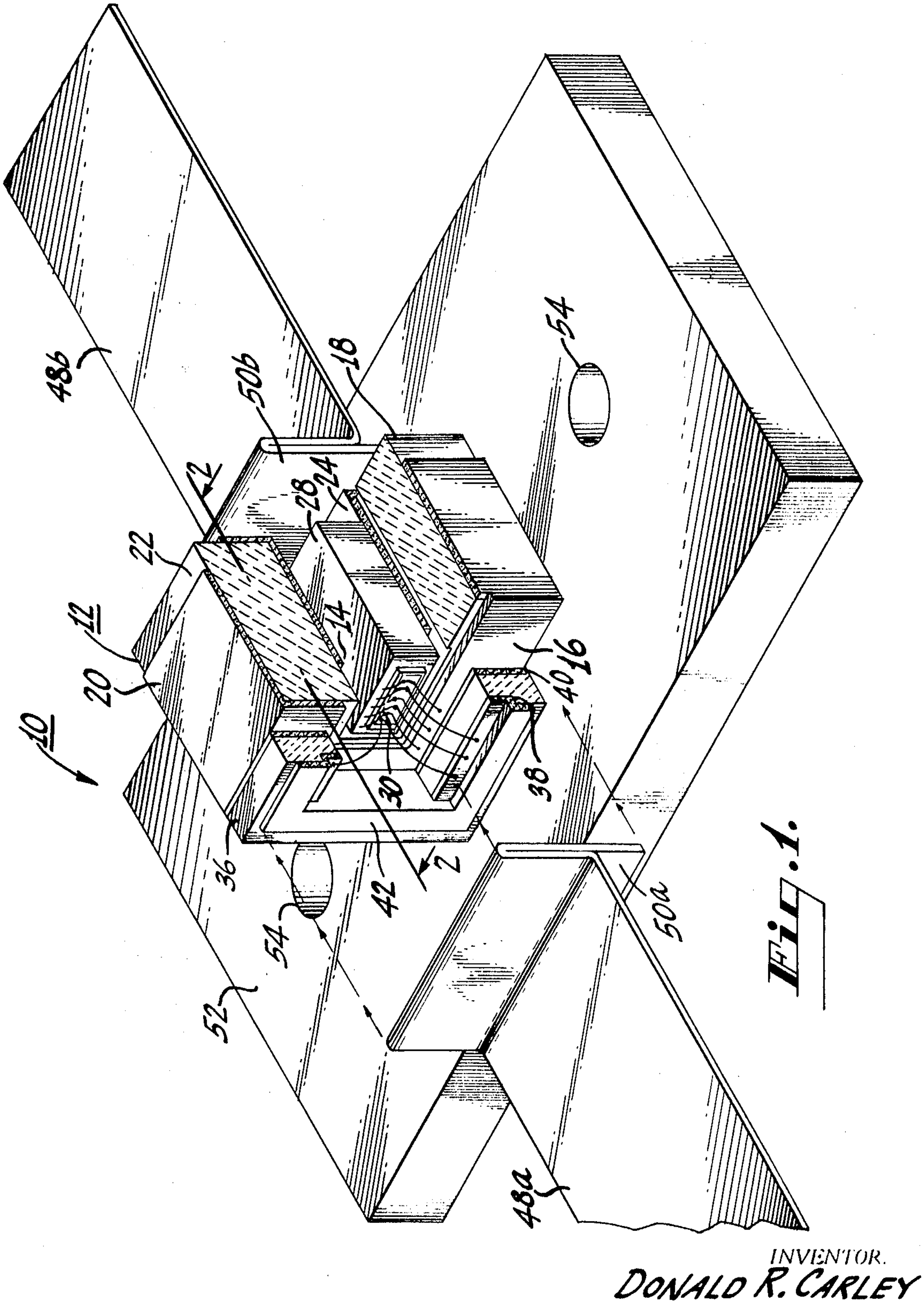
FIG. 1 is a partially exploded and partially broken away perspective view of a form of the transistor assembly of the present invention.
Figure 2:
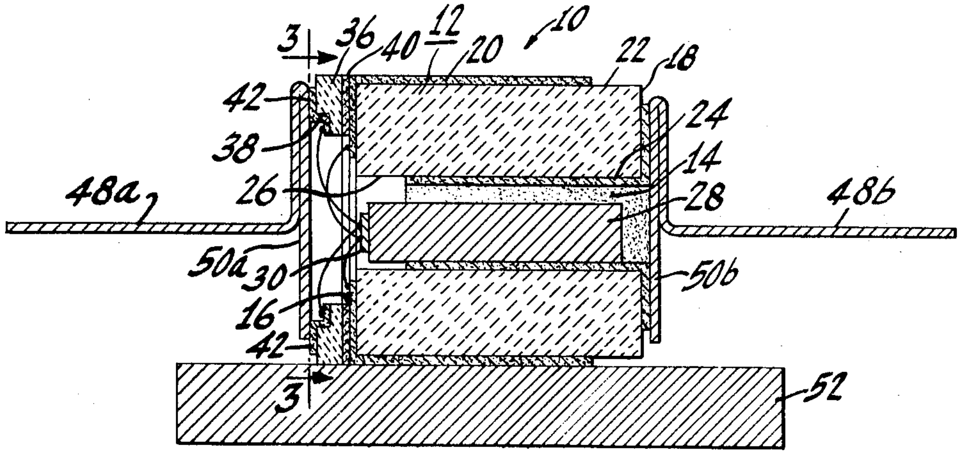
FIG. 2 is a sectional view of the transistor assembly taken along line 2—2 of FIG. 1.

Referring to the drawing, the transistor assembly of the present invention is generally designated as 10. The transistor assembly 10 comprises a housing 12 which is rectangular in transverse cross section and has a rectangular passage 14 extending therethrough from one end 16 to the other end 18. The housing 12 is made of an electrically insulating and thermally conductive material, such as beryllium oxide or aluminum oxide. A film 20 of an electrically conductive metal, such as silver, gold or copper, is coated on the end surface 16 and the outer surface 22 of the housing 12. The film 20 extends over the end surface 16 from a point spaced from the passage 14 to the outer surface 22 and then over the outer surface 22 to a point spaced from the end surface 18. A film 24 of the same kind of metal as the film 20 is coated on the inner surface 26 and the end surface 18 of the housing 12. The film 24 extends over the end surface 18 from a point spaced from the outer surface 22 to the inner surface 26 and then over the inner surface to a point spaced from the end surface 16.

A rectangular mounting block 28 of an electrically conductive metal, such as silver, molybdenum or copper, is within the passage 14 in the housing 12. The mounting block 28 is seated on and secured to the metal film 24, such as by brazing or soldering, so as to be electrically connected to the metal film 24 and mechanically and thermally connected to the housing 12. The mounting block 28 is of a length shorter than the length of the housing 12 and is positioned with one of its ends spaced from the end surface 16 of the housing.

Figure 3:
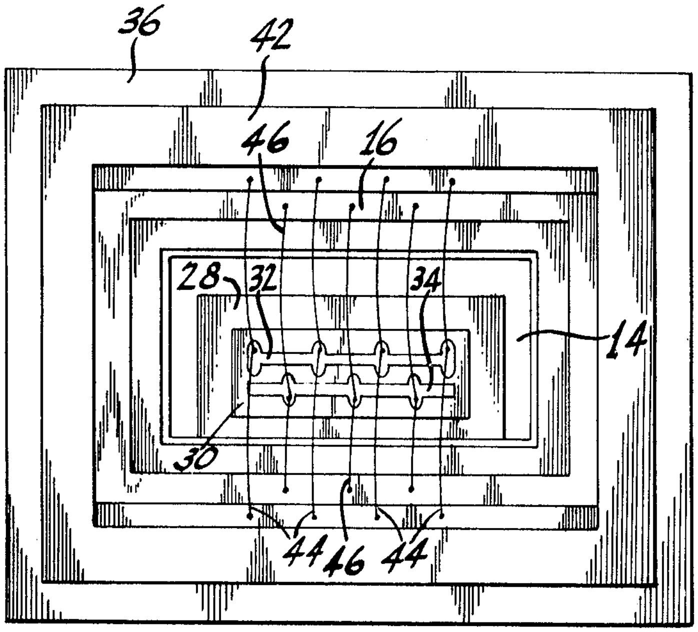
FIG. 3 is an enlarged end view of the transistor assembly taken along line 3—3 of FIG. 2 with the terminal removed.

A transistor element 30 is mounted on the end of the mounting block 28 which is adjacent the end surface 16 of the housing 12. Transistor element 30 is a flat, rectangular body of a semiconductor material, such as silicon, having a pair of PN junctions formed therein which provide base, emitter and collector electrode regions. A collector electrode is provided on the surface of the transistor element which is secured to the end of the mounting block 28 so that the collector electrode is electrically connected to the mounting block. Emitter and base electrodes 32 and 34 are provided on the other surface of the transistor element 30 as shown in FIG. 3. As shown, each the emitter and base electrodes 32 and 34 includes a plurality of fingers extending from one side of a bus bar and contact pads extending from the other side of the bus bar. The fingers of the contacts 32 and 34 are interdigitated.

A rectangular spacer ring 36 of an electrically insulating material, such as aluminum oxide or beryllium oxide, is secured to the end surface 16 of the housing 12. The outer dimensions of the spacer ring 36 are equal to the corresponding dimensions of the housing 12. The inner dimensions of the spacer ring 36 are slightly larger than the corresponding dimensions of the passage 14. A step 38 is provided in the outer end surface of the spacer ring 36 along each of two of the opposed inner edges of the spacer ring. A metal film 40 is coated on the inner end surface of the spacer ring 36. The metal film 40 is secured to the metal film 20 on the end surface 16 of the housing 12, such as by brazing or soldering, so as to mechanically secure the spacer ring to the housing. A film 42 of an electrically conductive metal is coated on the surfaces of the steps 38 and the outer end surface of the spacer ring 36.

The emitter electrode 32 of the transistor element 30 is electrically connected to the metal film 42 on the steps 38 of the spacer ring 36 by a plurality of wires 44. Each of the wires 44 is secured at one end to a contact pad of the emitter contact 32 and at its other end to the metal film 42. The base electrode 34 of the transistor element 30 is electrically connected to the metal film 20 on the end surface 16 of the housing 12 by a plurality of wires 46. Each of the wires 46 is secured at one end to a contact pad of the base contact 34 and at its other end to the metal film 20. Each of the contact pads of each of the transistor element electrodes 32 and 34 has two wires 44 and 46 respectively secured thereto with the wires extending in opposite directions to their respective metal films 42 and 20.

A pair of contact terminals 48*a* and 48*b* are provided at the opposite ends of the housing 12. Each of the terminals 48*a* and 48*b* is an elongated, flat strip of an electrically conductive metal, such as Kovar, which is bent at one end to provide a flat, rectangular head 50*a* and 50*b* respectively which is perpendicular to the terminal. The dimensions of the terminal heads 50*a* are slightly smaller than the dimensions of the end surfaces of the housing 12. Terminal heads 50*a* and 50*b* extend completely across the ends of the passage 14 in the housing 12 so as to enclose the passage and hermetically seal the transistor element 30 therein. The terminals 48*a* and 48*b* extend in opposite directions from the ends of the housing 12 and lie in the same plane.

The housing 12 is seated on a flat, rectangular mounting terminal plate 52 of an electrically and thermally conductive metal, such as copper. The metal film 20 on the housing 12 is secured to the metal plate 52, such as by brazing or soldering. Thus, the housing 12 is mechanically and thermally connected to the plate 52 and the metal film 20 is electrically connected to the plate. The plate 52 has a pair of mounting holes 54 therethrough.

In the transistor assembly 10, the collector electrode of the transistor element 30 is electrically connected to the terminal 48*b* through the mounting block 28 and the metal film 24 on the inner surface and end surface 18 of the housing 12. The emitter electrode 32 of the transistor element 30 is electrically connected to the terminal 48*a* through the wires 44 and the metal film 38 on the spacer ring 36. The base electrode 34 of the transistor element 30 is electrically connected to the metal plate 52 through the wires 46 and the metal film 20 on the end surface 16 and the outer surface of the housing 12. The transistor element 30 is thermally connected to the metal plate 52 through the mounting block 28, metal film 24, housing 12 and metal film 20. Thus, the metal plate 52 serves as one terminal for the transistor assembly 10 as well as a heat spreader for dissipating the heat generated by the transistor element. In addition, the metal plate 52 serves as a mounting means for the transistor assembly. Although the base electrode of the transistor element is shown as being electrically connected to the metal plate 52 and the emitter electrode being connected to the terminal 48*a*, if desired, these connections can be reversed by reversing the connections of the wires 44 and 46.

The transistor assembly 10 has all of the characteristics required for high-frequency operation. The transistor element 30 is hermetically sealed within the housing 12, and good heat transfer between the transistor element 30 and the plate 52 is provided by the mounting block 28 and the housing 12. The input and output terminals 48*a* and 48*b* are isolated by the housing 12 so as to reduce parasitic capacitances. The multiple, short length wires 44 and 46 reduce parasitic lead inductances. In addition, by having the input and output terminals 48*a* and 48*b* in the same plane and the terminal plate 52 in a plane parallel to the input and output terminals, the assembly 10 can be easily mounted in a microstrip or stripline type circuit.

I claim:

-. A semiconductor assembly comprising a. a housing of an electrically insulating and thermally conductive material, said housing having a passage extending therethrough from one end of the housing to the other end, b. a semiconductor element mounted in the passage in the housing and thermally connected to said housing, said semiconductor element having a plurality of electrodes, c. a first terminal on the outer surface of said housing d. a separate pair of metal contact terminals, one secured to each end of the housing and extending over the respective end of the passage so as to enclose said passage, and e. means electrically connecting the electrodes of the semiconductor element to the terminals.

2. A semiconductor assembly in accordance with claim 1 in which the means electrically connecting the first terminal to one of the electrodes of the semiconductor element includes a metal film coated on one end surface of the housing and on the outer surface of the housing, and the means electrically connecting one of the contact terminals to an electrode of the semiconductor element includes a metal film coated on the surface of the passage and the other end surface of the housing.

3. A semiconductor assembly in accordance with claim 2 including a spacer ring of an electrically insulating material secured to the one end of the housing, the contact terminal at the one end of the housing is secured to the spacer ring, and the means electrically connecting the contact terminal at the one end of the housing to its electrode of the semiconductor element includes a metal film coated on the outer end surface of the spacer ring.

4. A semiconductor assembly in accordance with claim 3 including an electrically and thermally conductive mounting block within the passage in the housing, said mounting block being electrically and mechanically secured to the metal film on the surface of the passage and having one end adjacent the one end surface of the housing, and the semiconductor element is mounted on said one end of the mounting block.

5. A semiconductor assembly in accordance with claim 4 in which the electrode of the semiconductor element which is connected to the contact terminals at the other end of the housing is on the surface of the semiconductor element which is secured to the mounting block, and the other electrodes of the semiconductor element are on the other surface of the semiconductor element.

6. A semiconductor assembly in accordance with claim 5 in which one of the electrodes on the other surface of the semiconductor element is electrically connected to the metal film on the one end surface of the housing by a wire, and the other electrode on the other surface of the semiconductor element is electrically connected to the metal film on the outer end surface of the spacer ring by a wire.

7. A semiconductor assembly in accordance with claim 6 in which each of the electrodes on the other surface of the semiconductor element is electrically connected to its respective metal film by a plurality of wires.

8. A semiconductor assembly in accordance with claim 7 in which each of the contact terminals comprises a flat metal strip having a flathead on one end, the head of one of the contact terminals is secured to the metal film on the outer end surface of the spacer ring and extends completely across the passage at the one end of the housing, and the head of the other contact terminal is secured to the metal film on the other end surface of the housing and extends completely across the end of the passage at the other end of the housing.

9. A semiconductor assembly in accordance with claim 8 in which the first terminal is a metal plate which is mechanically and electrically secured to the metal film on the outer surface of the housing.

10. A semiconductor assembly in accordance with claim 9 in which the housing and the passage through the housing are rectangular in transverse cross section.